United States Patent [19]

Van Meerbergen et al.

[11] Patent Number: 4,866,715
[45] Date of Patent: Sep. 12, 1989

[54] METHOD OF TESTING A MODIFIED BOOTH MULTIPLIER, MODIFIED BOOTH MULTIPLIER SUITABLE FOR TESTING BY MEANS OF THIS METHOD, AND INTEGRATED CIRCUIT COMPRISING SUCH A MODIFIED BOOTH MULTIPLIER

[75] Inventors: Jozef L. Van Meerbergen; Franciscus P. M. Beenker; Luc L. G. Matterne; Josephus A. Huisken; Rudi J. J. Stans, all of Eindhoven, Netherlands

[73] Assignee: U.S. Philips Corporation, New York, N.Y.

[21] Appl. No.: 144,294

[22] Filed: Jan. 15, 1988

[30] Foreign Application Priority Data

Jan. 29, 1987 [NL] Netherlands .................. 8700216

[51] Int. Cl.$^4$ ............................................. G06F 13/06
[52] U.S. Cl. ..................................... 371/27; 364/200
[58] Field of Search ................. 371/27, 15, 16, 25, 371/29; 364/200, 900, 737

[56] References Cited

U.S. PATENT DOCUMENTS

4,507,727  3/1985  Mayer ................................. 364/200
4,539,635  9/1985  Boddic ............................... 364/200
4,677,586  6/1987  Mayer ................................. 364/900

*Primary Examiner*—Michael R. Fleming
*Attorney, Agent, or Firm*—Thomas A. Briody; Jack E. Haken; Anne E. Barschall

[57] ABSTRACT

A modified Booth multiplier for multiplying an m-bit number X by an n-bit number Y comprises a Booth encoder for converter the number Y in groups of 3 bits which overlap by 1 bit into a series Y' of multiplication values whose number is equal to or substantially equal to half the number of bits of Y. There is also provided a multiplex circuit for forming partial products from the number X and said series Y' and a matrix configuration of full adders for adding the partial products in incremental positions. The design is such that the constituent components and the operation of the modified Booth multiplier can be tested by means of a very small number of test patterns which are generated in the Booth multiplier after application of a specific series of X,Y-values. Test patterns are generated for establishing static as well as dynamic errors in the combination formed by the Booth encoder and the multiplex circuit and also test patterns which are formed by specific partial products in order to establish static errors in the matrix configuration. In practice the modified Booth multiplier is usually constructed as a multiplier accumulator; in that case test patterns formed by partial products are also used for establishing static errors in the accumulator section.

23 Claims, 8 Drawing Sheets

| y(i+1) | y(i) | y(i−1) | y'(i) |
|---|---|---|---|
| 0 | 0 | 0 | 0 |
| 0 | 0 | 1 | +1 |
| 0 | 1 | 0 | +1 |
| 0 | 1 | 1 | +2 |
| 1 | 0 | 0 | −2 |
| 1 | 0 | 1 | −1 |
| 1 | 1 | 0 | −1 |
| 1 | 1 | 1 | 0 |

| y'(i) | x(m−1) | ... | x(1) | x(0) | |
|---|---|---|---|---|---|
| 0 | 0 | ... | 0 | 0 | 0 |
| +1 | x(m−1) | ... | x(1) | x(0) | 0 |
| +2 | x(m−1) | x(m−2) ... | x(0) | 0 | 0 |
| −2 | $\overline{x(m-1)}$ | $\overline{x(m-2)}$ ... | $\overline{x(0)}$ | 1 | 1 |
| −1 | $\overline{x(m-1)}$ | ... | $\overline{x(1)}$ | $\overline{x(0)}$ | 1 |

| IN | FA1-5 | FA6-10 | FA11-15 | FA16 | FA18 | FA20, 22, 24 | FA26 | FA17, 19 | FA21, 23, 25 | FA27 |
|---|---|---|---|---|---|---|---|---|---|---|
| 000 | #0 | #0 | #0 | #0 | #0 | #0 | #0 | #0 | #0 | #0 |
| 001 | #0- | #0- | #0- | #0- | #0- | #0- | #0- | #0- | #0- | #0- |
| 010 | #1 | #1 | #1 | #1 | #1 | #1 | #1- | #1- | #1- | #9 |
| 011 | #1- | #1- | #1- | #1 | #1 | #1 | #1 | #1 | #1 | #9- |
| 100 | #3.1 | #3.2 | #3.3 | #5 | #5 | #5 | #7- | #5 | #5 | #7- |
| 101 | #3.1- | #3.2- | #3.3- | #4 | #4 | #4 | #4 | #4 | #4 | #4 |
| 110 | #2 | #2 | #2 | — | #6a | #8 | #8 | #6b | #8- | #1- |
| 111 | #2- | #2 | #2- | — | #6b | #8- | #8- | #6a | #8 | #1 |

FIG. 10

| y(-1) | y(0) | y(1) |      | y(3) | y(4) | y(5) |      | y(7) |     |
|       |      | y(1) | y(2) | y(3) |      | y(5) | y(6) | y(7) |     |
| --- | --- | --- | --- | --- | --- | --- | --- | --- | --- |
| 0 | 0 | 0 | 0 | 0 | 0 | 0 | 0 | 0 | ... |
| 1 | 1 | 1 | 1 | 1 | 1 | 1 | 1 | 1 | ... |
| 0 | 1 | 0 | 1 | 0 | 1 | 0 | 1 | 0 | ... |
| 1 | 0 | 1 | 0 | 1 | 0 | 1 | 0 | 1 | ... |
| 1 | 1 | 0 | 1 | 1 | 1 | 0 | 1 | 1 | ... |
| 0 | 0 | 1 | 0 | 0 | 0 | 1 | 0 | 0 | ... |
| 0 | 1 | 1 | 1 | 0 | 1 | 1 | 1 | 0 | ... |
| 1 | 0 | 0 | 0 | 1 | 0 | 0 | 0 | 1 | ... |

FIG. 11

| x(i-1) | x(i) | y(-1) | y(0) | y(1) |      | y(3) | y(4) | y(5) |     |
|        |      |       |      | y(1) | y(2) | y(3) |      | y(5) | ... |
| --- | --- | --- | --- | --- | --- | --- | --- | --- | --- |
| 0 | 0 | 0 | 1 | 0 | 1 | 0 | 1 | 0 | ... |
| 0 | 0 | 0 | 0 | 0 | 0 | 0 | 0 | 0 | ... |
| 0 | 0 | 0 | 1 | 0 | 1 | 0 | 1 | 0 | ... |
| 1 | 1 | 1 | 1 | 1 | 1 | 1 | 1 | 1 | ... |
| 1 | 1 | 1 | 0 | 1 | 0 | 1 | 0 | 1 | ... |
| 1 | 1 | 1 | 1 | 0 | 1 | 1 | 1 | 0 | ... |
| 1 | 1 | 0 | 0 | 1 | 0 | 0 | 0 | 1 | ... |
| 1 | 1 | 0 | 1 | 1 | 1 | 0 | 1 | 1 | ... |
| 1 | 1 | 1 | 0 | 0 | 0 | 1 | 0 | 0 | ... |
| 0 | 0 | 1 | 1 | 0 | 1 | 1 | 1 | 0 | ... |
| 0 | 0 | 0 | 1 | 1 | 1 | 0 | 1 | 1 | ... |
| 0 | 0 | 0 | 0 | 1 | 0 | 0 | 0 | 1 | ... |
| 0 | 0 | 1 | 0 | 0 | 0 | 1 | 0 | 0 | ... |
| 1 | 1 | 0 | 1 | 0 | 1 | 0 | 1 | 0 | ... |
| 0 | 0 | 1 | 0 | 1 | 0 | 1 | 0 | 1 | ... |

METHOD OF TESTING A MODIFIED BOOTH MULTIPLIER, MODIFIED BOOTH MULTIPLIER SUITABLE FOR TESTING BY MEANS OF THIS METHOD, AND INTEGRATED CIRCUIT COMPRISING SUCH A MODIFIED BOOTH MULTIPLIER

BACKGROUND OF THE INVENTION

The invention relates to a method of testing a modified Booth multiplier for multiplying an m-bit value $|X=x(m-1)\ldots x(1)x(0)$, where x (0) is the least-significant bit$|$, by an n-bit value $|Y=y(n-1)\ldots y(1)\ y(0)$, where y(0) is the least-significant bit$|$. The modified Booth multiplier comprises a Booth encoder in which the n-bit value is converted into a series of multiplication values $(Y'=y'(k-2)\ldots y'(2)\ y'(0)$, where $k=n$ if n is even and $k=n+1$ if n is odd. The conversion occurs in groups of 3 bits, which overlap each time by one bit. The groups of 3 bits take the form $y(i-1)\ y(i)\ y(i+1)$, where $i=0, 2, 4, \ldots n-1$ if n is even and $i=0, 2, 4, \ldots n-1$ if n is odd. The bits $y(-1)$ and, if n is odd, and y(n) have adjustable values. The modified booth multiplier further comprises a multiplex circuit for forming partial products $(X.y'(j))$, and a matrix configuration of full adders for adding the successively obtained partial products in incremental positions. According to the method a number of test patterns is obtained in the modified Booth multiplier on the basis of specifically applied X,Y values. The test patterns produce values, on an output of the modified Booth multiplier, that reveal whether the modified Booth multiplier is defective.

The design of a modified Booth multiplier should be aimed not only at realizing specific functions in a given structure, but also at taking into account the testability of the modified Booth multiplier. The hardware of the modified Booth multiplier should be such that its constituent components and its operation can be simply tested. It is always possible, that is to say without taking specific steps, to generate a variety of series of test patterns for supply to the modified Booth multiplier and to test an output thereof as regards the values associated with the relevant test pattern. For a modified Booth multiplier for a substantial number of bits to be processed, the number of feasible test patterns is so large that this method of testing is not very efficient and often even impracticable.

SUMMARY OF THE INVENTION

It is the object of the invention to perform the described method so that the modified Booth multiplier can be tested substantially completely by means of a limited number of specifically selected test patterns.

To achieve this, the method of the kind set forth in accordance with the invention is characterized in that test patterns are generated for which all groups of 3 bits which overlap by 1 bit successively form all 8 input signal combinations. The coincident series of groups of 3 bits to be simultaneously applied to the Booth encoder together the Y-part of the test patterns for the Booth encoder and the multiplex circuit. Any errors occurring in the Booth encoder or the multiplex complex are propagatable through the multiplex circuit by an associated X-part of the test patterns, to the adjustable value of $y(-1)$ and, if n is odd, also of y(n). There is assigned in the Booth encoder a first value which is associated with a respective test pattern. Test patterns are also generated for which all 8 input signal combinations are successively applied to the three inputs of the various full adders of the matrix configuration. Each time one and the same input signal combination are simultaneously applied to groups of full adders to be tested. A second value which is associated with a relevant test pattern for the matrix configuration is applied to the carry input of the full adders which constitute the first row of full adders of the matrix configuration and to the carry input of the full adder which determines the least-significant bit of the product (X,Y) to be obtained.

The number of feasible test patterns is determined by the number of bits of X and Y. In principle $2^{n+m}$ test patterns can be generated. For testing, however, a much smaller number suffices. By suitably selecting the test patterns, in accordance with the invention the Booth encoder and the multiplex circuit can be optimally or substantially optimally tested by utilizing only 15 test patterns. For the optimum or substantially optimum testing of the matrix configuration it is sufficient to use $15+2(\frac{1}{2}k-1)$ test patterns, $\frac{1}{2}k$ being the number of partial products formed in the modified Booth multiplier. Fewer test patterns can also be used, but in that case fewer components will be tested or components will not be completely tested. Similarly, a larger number of test patterns can be used, for example due to a less favourable choice of the test patterns. Therefore, the invention is not restricted to the number of test patterns stated herein. The number of test patterns required for optimum or substantially optimum testing can also be influenced by the specific construction of the modified Booth multiplier. In a given construction, the matrix configuration can be optimally or substantially optimally tested by means of 17 test patterns, that is to say a number which is independent of the number of partial products formed in the Booth multiplier; the construction of the matrix configuration, however, in that case requires substantially more hardware. When the matrix configuration is combined with an accumulator as is customarily done in practice, in accordance with the invention it is attractive to use 3 further test patterns for optimum or substantially optimum testing. A plurality of test patterns may also be used for testing the accumulator.

The invention also relates to a modified Booth multiplier for multiplying an m-bit value $(X=x(m-1)\ldots x(1)\ x(0)$, where x(0) is the least-significant bit) by an n-bit value $(Y=y(n-1)\ldots y(1)\ y(0)$, where y(0) is the least-significant bit). The modified Booth multiplier comprises a Booth encoder in which the n-bit value is converted into a series of multiplication values $(Y'=y'(k-2)\ldots y(2)\ y'(0)$, where $k=n$ if n is even and $k=n+1$ if n is odd. The conversion occurs in groups of 3 bits, which overlap each time by one bit. The groups of 3 bits take the form $y(i-1)\ y(i)\ y(i+1)$, where $i=0, 2, 4, \ldots n-1$ if n is even and $i=0, 2, 4, \ldots n-1$ if n is odd. The bits $y(-1)$ and, if n is odd, and y(n) have adjustable values. The modified booth multiplier further comprises a multiplex which is connected to the Booth encoder for forming partial products $(X.y'(j))$, and a matrix configuration of full adders which is connected to the multiplex circuit for adding the successively obtained partial products in incremental positions, which modified Booth multiplier can be tested by means of the method in accordance with the invention.

The modified Booth multiplier in accordance with the invention is characterized in that the Booth encoder comprises a connection from the adjustable value of y(−1) and, if n is odd, also for y(n). A first value associated with a relevant test pattern is applied to the Booth encoder via the connection. There also being a carry connection for the carry input of the full adders which constitute the first row of full adders of the matrix configuration and for the carry input of the full adder which determines the least-significant bit of the product (X.Y) to be obtained. A second value associated with a relevant test pattern for the matrix configuration is applied via the carry connection to the relevant full adders.

The invention also relates to an integrated circuit, for example a chip, provided with a modified Booth multiplier in accordance with the invention. Brief description of the Figures.

BRIEF DESCRIPTION OF THE DRAWING

The invention will be described in detail hereinafter with reference to the accompanying drawings; therein.

DETAILED DESCRIPTION OF THE PREFERRED EMBODIMENTS

Corresponding parts are denoted by corresponding reference numerals in the various Figures. The invention is by no means restricted to the embodiment to be described with reference to the drawings, this embodiment merely serves to illustrate the invention.

CONSTRUCTION AND OPERATION OF A MODIFIED BOOTH MULTIPLIER-ACCUMULATOR

Figure 1:
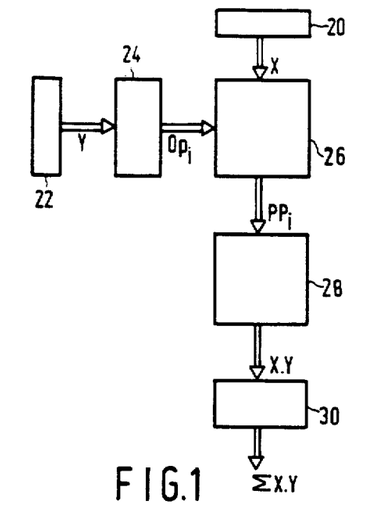
FIG. 1 shows a block diagram of a modified Booth multiplier-accumulator.

FIG. 1 shows a block diagram of a modified Booth multiplier-accumulator. The multiplier-accumulator comprises an X register 20, a Y register 22, a Booth encoder 24, a multiplex circuit 26, a matrix configuration of full adders 28, and an accumulator 30. The multiplier-accumulator operates in a two's complement digital representation. In the register 20 there is stored an m-bit multiplicand $X = x(m-1) \ldots x(1) x(0)$, where $x(0)$ is the least-significant bit, and in the register 32 there is stored an n-bit multiplier $Y = y(n-1) \ldots y(1) y(0)$, where $y(0)$ is the least-significant bit. Normally a multiplication is performed by first forming partial products $X.y(i)$, where $i = 0, 1, \ldots n-1$, and by subsequently adding the successively obtained partial products shifted by one bit with respect to one another. In a modified Booth multiplier, the number of partial products is substantially reduced. In the Booth encoder 24 the value Y is converted into a series of multiplication values $Y = y'(k=2) \ldots y'(2) y'(0)$, where $y'(i) = y(i) + y(i-1) - 2.y(i+1)$, where $i = 0, 2, \ldots k-2$, while in the Booth encoder a bit $y(-1) = 0$ is added and, if n is odd, also a bit $y(n) = y(n-1)$. In this respect $k = n$ if n is even and $k = n+1$ if n is odd. In other words, if n is even, the n-bit multiplier is converted into a series of $\frac{1}{2}n$ multiplication values and if n is odd, the n-bit multiplier is converted into a series of $\frac{1}{2}(n+1)$ multiplication values.

Partial products $X.y'(i)$, where $i = 0, 2, \ldots k-2$, are formed by multiplying the multiplicand X by the multiplication values $y'(i)$. This is performed in the multiplex circuit 26. Because the number of partial products is reduced by a factor two or almost two, the product formation by addition of the successively obtained partial products, albeit each time shifted by two bits with respect to one another, is simpler. Because $y'(i)$ can assume the values 0, +1, −1, +2 or −2, the partial products PP(i) are obtained by multiplying the multiplicand X by 0, +1, −1, +2 and −2, respectively; these partial products are referred to hereinafter as (0), (+X), (−X), (+2X) and (−2X), respectively. The partial products PP(i) are added in the matrix configuration of full adders 28. The values X.Y successively derived from this matrix configuration can be accumulated in the accumulator 30, if desired. The accumulator then supplies a sum value ΣX.Y.

Figure 2:
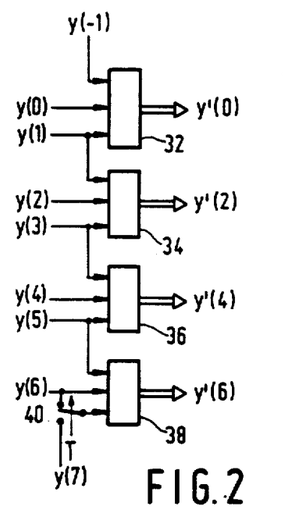
FIG. 2 shows a block diagram of a Booth encoder included in a modified Booth multiplier-accumulator.

FIG. 2 shows how the Booth encoder 24 of the modified Booth multiplier-accumulator shown in FIG. 1 is composed of a number of encoding circuits which is determined by the number of bits of the multiplier Y. In the Booth encoder 24 the n-bit multiplier in groups of 3 bits which overlap each time by 1 bit is converted into said series of multiplication values Y'. To achieve this, the additional bit $y(-1) = 0$ and the bits $y(0)$, $y(1)$ are applied to the first encoding circuit, the second encoding circuit receiving the bits $y(1)$, $y(2)$, $y(3)$, the third encoding circuit receiving the bits $y(3)$, $y(4)$, $y(5)$ etc. if n is even, the bits $y(n-3)$, $y(n-2)$, $y(n-1)$ are applied to the last encoding circuit and, if n is odd, it receives the bits $y(n-2)$, $y(n-1)$ and an additional bit $y(n) = y(n-1)$. FIG. 2 shows only four encoding circuits 32, 34, 36 and 38. The multiplier Y in this case consists of 7 bits $y(6) \ldots y(1) y(0)$, so that the bits $y(-1) = 0$ and $y(7) = y(6)$ have been added. The bit $y(7)$ is applied via a switch 40 whose function will be described in detail hereinafter but which occupies the position shown in the Figure in the present situation.

Figure 3:
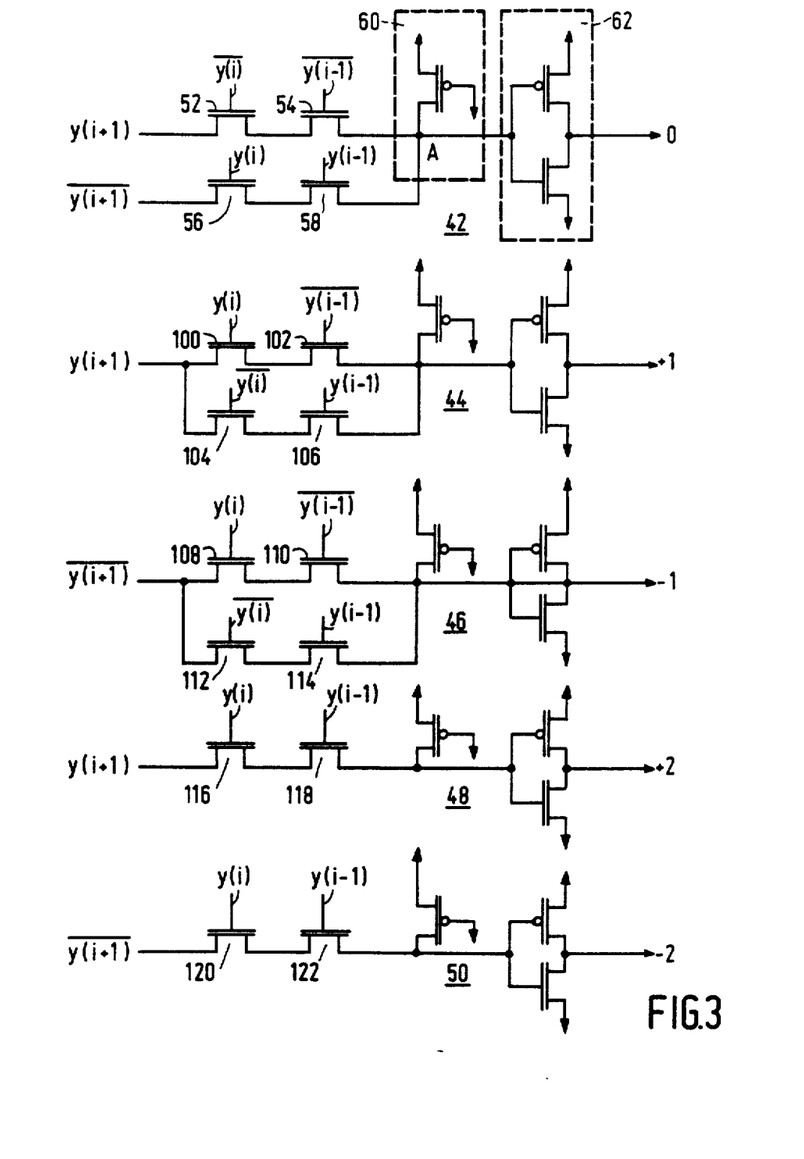
FIG. 3 shows an embodiment of one of the encoding circuits of the Booth encoder.
Figure 4:
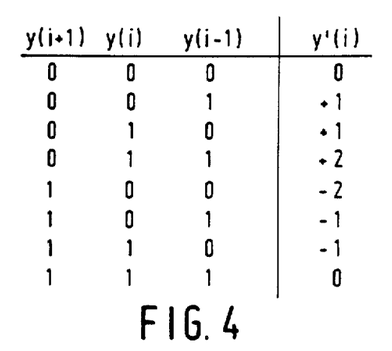
FIGS. 4 and 5 show tables illustrating the operation of the Booth encoder and of the multiplexer circuit included in the Booth multiplier-accumulator, respectively.

Each of the encoding circuits 32, 34, 36 and 38 is constructed as shown in FIG. 3. An encoding circuit is composed of five sub-circuits 42, 44, 46, 48 and 50. Each of these sub-circuits receives the bits $y(i+1)$, $y(i)$, $y(i-1)$ and/or their inverse values. The sub-circuit 42 is composed of a specific gate circuit, formed by FETs 52, 54, 56 and 58, a circuit 60 for keeping the output A of the gate circuit at the value 1 when the FETs are turned off, and an inverter 62. When the gate circuit is blocked, the output of the inverter is 0. The output of the inverter 62 becomes 1 if $y(i+1) = 0$ and the FETs 52 and 54 are turned on, i.e. if $y(i) = 0$ and $y(i-1) = 0$, and if $y(i+1) = 1$ and the FETs 56 and 58 are turned on, i.e. if $y(i) = 1$ and $y(i-1) = 1$. Each of the sub-circuits 44, 46, 48 and 50 comprises a specific gate circuit whose operation will be appreciated from the foregoing description of the sub-circuit 42, and also a gate circuit which is similar to the circuit 60 and an inverter which is similar to the inverter 62. The output signal of the sub-circuits 42, 44, 46, 48 and 50 represent the multiplication values 0, +1, −1, +2 and −2, respectively. In the table given in FIG. 4 the multiplication values are given as a function of the input signals of an encoding circuit.

The multiplication values y'(i) supplied by the successive encoding circuits are successively applied to the multiplex circuit 26. Using these multiplication values, therein an m-bit multiplicand X is converted into an (m+2)-bit partial product PP(i), that is to say in accordance with the table given in FIG. 5.

Figure 5:
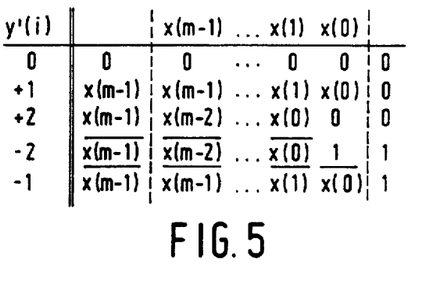
Figure 6:
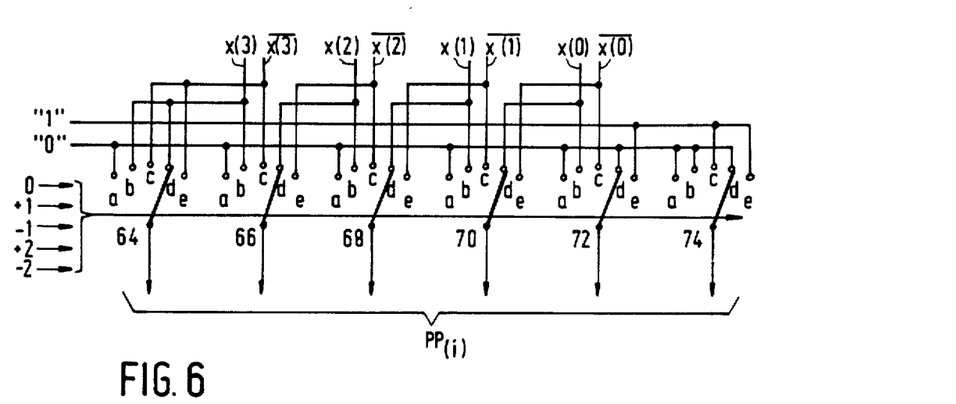
FIG. 6 diagrammatically shows the multiplex circuit included in the Booth multiplier-accumulator.

FIG. 6 schematically shows a multiplex circuit 26 in which the partial products can be obtained in conformity with the table shown in FIG. 5, i.e. for a 4-bit multiplicand X. This circuit in principle comprises m+2, so in this case 6, multiplexers 64, 66, 68, 70, 72 and 74, each of which has 5 input positions, corresponding to the number of multiplication values y'(i). The value y'(i)=0 sets the multiplexers to the position a and the bits 000000 are conducted; the value y'(i)=+1 sets the multiplexers to the position b and the bits x(3) x(2) x(1) x(0) 0 are conducted; the value y'(i)=−1 sets the multiplexers to the position c and the bits $\overline{x(3)}$ $\overline{x(3)}$ $\overline{x(2)}$ $\overline{x(1)}$ $\overline{x(0)}$ 1 are conducted; the value y'(i)=+2 sets the multiplexers to the position d and the bits x(3) x(2) x(1) x(0) 0 0 are conducted; the value y'(i)=−2 sets the multiplexers to the position e and the bits $\overline{x(3)}$ $\overline{x(2)}$ $\overline{x(1)}$ $\overline{x(0)}$ 1 1 are conducted.

Figure 7:
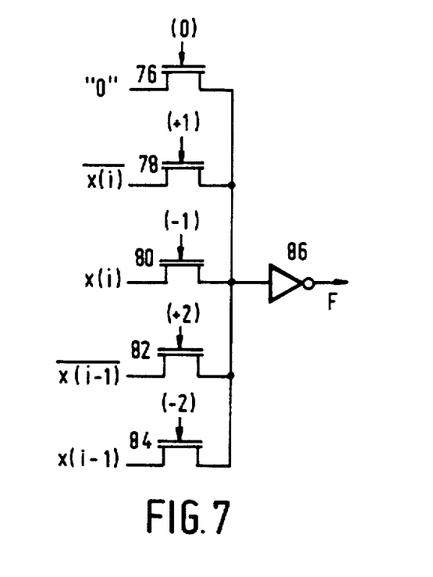
FIG. 7 shows an embodiment of one of the multiplexers included in the multiplex circuit.

FIG. 7 shows an embodiment of an "1-out-of-5" multiplexer. This multiplexer is composed of FETs 76, 78, 80, 82 and 84 and an inverter 86. The FETs can be turned on by the multiplication values y'(i). For example, the value y'(i)=+1 sets the multiplexer to the position b, which means that the FET 78 is turned on so that one of the relevant bits of the partial product to be obtained is conducted. Because of the presence of an inverter 86, the fact that the input signals should be replaced by their inverse values must be taken into account on the input of the 1-out-of-5 multiplexer.

Figure 8:
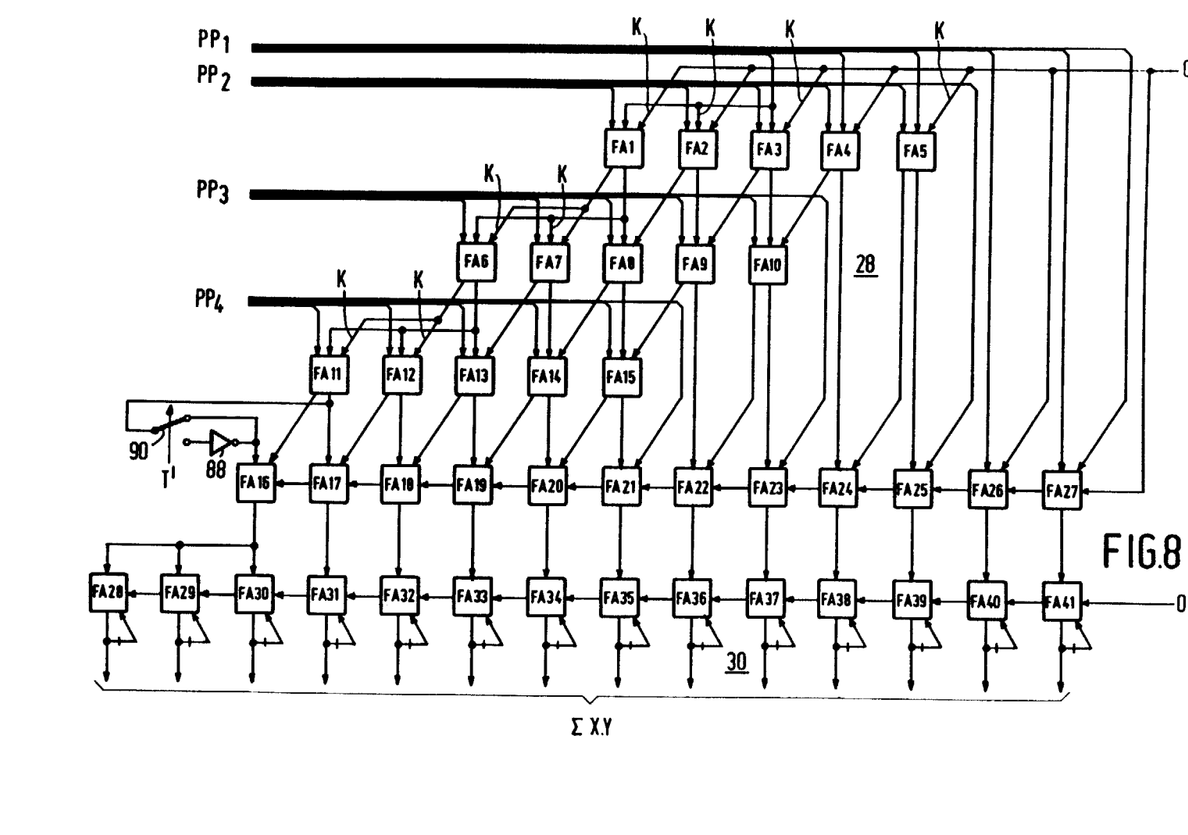
FIG. 8 shows the matrix configuration with the accumulator of the Booth multiplier-accumulator.

The partial products PP(i) successively obtained are applied to a matrix configuration of full adders 28 and are added therein, each time shifted two bits with respect to one another. The number of partial products amounts to $\frac{1}{2}$k, where k=n if n is even and k=n+1 is n is odd. The number of bits per partial product amounts to m+2. For correct addition of these partial products, taking into account the sign propagation to be observed in the two's complement representation, use is made of ($\frac{1}{2}$k−1) (m+1)+(m+k) full adders which can be arranged, for example in $\frac{1}{2}$k−1 rows of m+1 full adders each, plus a sum row of m+k full adders. A matrix configuration of this kind for four 6-bit partial products PP(1), PP(2), PP(3) and PP(4) is shown in FIG. 8. Therein, m=4 and n=7, so that k=8, with the result that 27 full adders are provided. These full adders are denoted by the references FA1 to FA27.

The full adders comprise two inputs p and q for values to be added, a carry input r, a sum output s and a carry output c, where c=(p+q) r+pq and s=c(p+q+r)+pqr. The sum value s is each time vertically passed on in the matric configuration in known manner, the carry output value c being passed on diagonally. The initial value 0 is applied to the carry input of the full adders FA1 to FA5 and FA27. When the multiplicand X is multiplied for the value y'(i)=−1 of −2, the partial product bit added to the least-significant side will be 1 as appears from the table shown in FIG. 5. Because in two's complement representation a negative value is obtained by inverting the bits of the corresponding positive value, increased by 1, the least-significant bit of the partial products is added to the least-significant bit but one of these partial products in the present embodiment; this is realized in the full adders FA21, FA23, FA25 and FA27. Because the construction and operation of the matrix configuration itself are known, they need not be elaborated herein.

The product X.Y output by the full adders FA16 to FA27 is applied to an accumulator 30 which also consists of full adders. The number of full adders used depends on the desired capacity of the accumulator. Taking into account the sign indication to be observed for the two's complement representation, the embodiment shown comprises 14 full adders FA28 to FA41. The construction and operation of the accumulator itself are known and need not be elaborated herein; it is only to be noted that the initial value 0 is applied to the carry input of the full adder FA41. The value output of the accumulator represents the sum of the products obtained as from a given instant, that is to say $\Sigma X.Y$.

The operation of the modified Booth multiplier accumulator will be further illustrated with reference to an example. Assume that X=1011, or −5 in two's complement representation and that Y=1011011, or −37 in two's complement representation. The following groups of 3 bits are then applied to the encoding circuits 32, 34, 36 and 38 shown in FIG. 2: 110, 101, 011 and 110. As appears from the table shown in FIG. 4, the values y'(i): −1, −1, +2 and −1 correspond to these groups of three bits. When these values y'(i) are applied to the mulltiplex circuit as shown in FIG. 6, the partial products PP(1)=001001, PP(2)=001001, PP(3)=101100 and PP(4)=001001 will be obtained. When these products are applied to the matrix configuration 28 shown in FIG. 8, the full adders FA16 or FA27 will supply the product X.Y=000010111001 or +185. When this product is transferred to the accumulator and increased therein by the same value, the full adders FA28 or FA41 will supply the sum product $\Sigma X.Y$=00000101110010 or +370.

TESTING THE MATRIX CONFIGURATION OF FULL ADDERS

Using specifically supplied X,Y-values, in the modified Booth multiplier-accumulator there can be generated test patterns which produce values on an output thereof which reveal whether or not the multiplier-accumulator is defective. By generating a specific series of test patterns, a given set of errors can be tested for. These may be errors in the Booth encoder, the multiplex circuit, the matrix configuration and the accumulator, as well as in the connections between these components. However, it will be impracticable to test for all feasible errors in these components or the connections therebetween. The errors occurring may be static as well as dynamic. For the matrix configuration and the accumulator, it appears to be sufficient to the test only for errors of a static nature because the circuits consist of static CMOS transistor logic, while the Booth encoder and the multiplex circuit should be tested for errors having a static as well as dynamic nature because these components consist of dynamic CMOS transistor logic.

First the test patterns for the matrix configuration of full adders will be considered. Specifically supplied X,Y-values generate such a number of series of test patterns in the multiplier accumulator that all 8 input signal combinations are obtained at least once on the three inputs of each full adder or at least of the majority of the full adders, groups of full adders always simultaneously receiving the same input signal combinations. In the arrangement of the full adders as shown in FIG. 8 these groups can be formed, as will be described hereinafter, by all full adders of the matrix configuration, by one or more rows of full adders of the matrix configuration, and by full adders which are situated on one or more diagonals of the matrix configuration. For testing the matrix configuration of full adders, the carry input of the first row of full adders in the matrix configuration and the carry input of the full adder which determines the least-significant bit of the product X.Y to be obtained should be accessible so that a similar value, associated with a respective test pattern for the matrix configuration, can be applied to these carry inputs. A test pattern for the matrix configuration is formed by a series of specific partial products as obtained by a normal multiplication of a corresponding specific X value and Y value in the modified Booth multiplier accumulator. Considering the described operation of the Booth encoder and the multiplier circuit it will be evident how to select the X values and Y values resulting in a specific series of partial products forming a test pattern.

The test patterns for the matrix configuration will be described in detail hereinafter with reference to the matrix configuration 28 shown in FIG. 8 which receives each time a test pattern of in this case four 6-bit partial products, the carry input of the full adders FA1 to FA5 and FA27 thereof receiving the same value associated with a relevant test pattern. The input signal combinations are represented by (P', p'q' r'), the signals of said combinations corresponding to those on the inputs p, q, r of the full adders.

By applying the test pattern (#0), consisting of the partial products 000000, 000000, 000000 and 000000, the response to the input signal combination (0,0,0) is tested for all full adders FA1 to FA27. The carry input of the full adders FA1 to FA5 and FA27 is then 0.

By applying the inverted test pattern (#0-), consisting of the partial products 111111, 111111, 111111 and 111111, the response to the input signal combination (1,1,1) is tested for all full adders FA1 to FA27. The carry input of the full adders FA1 to FA5 and FA27 is then 1.

By applying the test pattern (#1), consisting of the partial products 111111, 000000, 000000 and 000000, the response to the input signal combination (0,1,0) is tested for the full adders FA1 to FA15, the carry input of the full adders FA1 to FA5 and FA27 being 0. The response to the same input signal combination (0,1,0) albeit now for the full adders FA16 or FA26, is tested by applying the inverted test pattern (#1-), consisting of the partial products 000000, 111111, 111111, and 111111, the carry input of the full adders FA1 to FA5 and FA27 being 1. For the full adder FA27 the response to the input signal combination (0,1,0) is tested by means of the test pattern (#9), consisting of the partial products 000001, 000001, 000001 and 000001, the carry input of the full adders FA1 to FA5 and FA27 being 0.

By application of said test pattern (#1-) and the associated setting of the carry input of the full adders FA1 to FA5 and FA27, the response to the input signal combination (1,0,1) is tested for the full adders FA1 to FA15. The response to the same input signal combination (1,0,1) but now for the full adders FA16 to FA26 is tested by applying said test pattern (#1) and the associated setting of the carry input of the full adders FA1 to FA5 and FA27. For the full adder FA27 the response to the input signal combination (1,0,1) is tested by the inverted test pattern (#9-), consisting of the partial products 111110, 111110, 111110 and 111110, the carry input of the full adders FA1 to FA5 and FA27 being 1.

By applying the test pattern (#3.1), consisting of the partial products 111111, 000000, 111111 and 111111, the response to the input signal combination (0,1,1) is tested for the first row of full adders, that is to say the full adders FA1 to FA5, the carry input of the full adders FA1 to FA5 and FA27 being 1. The response to the same input signal combination (0,1,1), but now for the second full adders, that is to say the full adders FA6 to FA10, is tested by applying the test pattern (·3.2), consisting of the partial products 111111, 111111, 000000 and 111111, the carry input of the full adders FA1 to FA5 and FA27 again being 1. The response to the input signal combination (0,1,1), but now for the third row of full adders, that is to say the full adders FA11 to FA15, is tested by applying the test pattern (#3.3), consisting of the partial products 111111, 111111, 111111 and 000000, the carry input of the full adders FA1 to FA5 and FA27 again being 1. For the full adders FA16 to FA25 the response to the input signal combination (0,1,1) is tested by applying the test pattern (#5), consisting of the partial products 111111, 111111, 111111 and 111111, the carry input of the full adders FA1 to FA5 and FA27 being 0. Finally, for the full adders FA26 and FA27 the response to the input signal combination (0,1,1) is tested by applying the inverted test pattern (#7-), consisting of the partial products 110001, 110001, 110001 and 110001, the carrying input of the full adders FA1 to FA5 and FA27 being 1.

By applying the inverted test pattern (#3.1-), consisting of the partial products 000000, 111111, 000000 and 000000, the response to the input signal combination (1,0,0) is tested for the first row of full adders, that is to say the full adders FA1 to FA5, the carry input of the full adders FA1 to FA5 and FA27 being 0. The response to the same input signal combination (1,0,0), but now for the second row of full adders, that is to say the full adders FA6 to FA10, is tested by applying the inverted test pattern (#3.2-), consisting of the partial products 000000, 000000, 111111 and 000000, the carry input of the full adders FA1 to FA5 and FA27 again being 0. The response to the input signal combination (1,0,0), but now for the third row of full adders, that is to say the full adders FA11 to FA15, is tested by applying the inverted test pattern (#3.3-), consisting of the partial products 000000, 000000, 000000 and 111111, the carry input of the full adders FA1 to FA5 and FA27 again being 0. For the full adders FA16 to FA27 the response to the input signal combination (1,0,0) is tested by applying the test pattern (#4), consisting of the partial products 111110, 000000, 000000 and 000000, the carry input of the full adders FA1 to FA5 and FA27 being 0.

By applying the test pattern (#2), consisting of the partial products 000000, 000000, 111111 and 000000, the response to the input signal combination (0,0,1) is tested for the odd rows of full adders, that is to say the full adders FA1 to FA5 and FA11 to FA15, the carry input of the full adders FA1 to FA5 and FA27 being 1. The response to the same input signal combination (0,0,1), but now for the even row of full adders, that is to say the full adders FA6 to FA10, is tested by applying the inverted test pattern (#2-), consisting of the partial products 111111, 111111, 000000 and 111111, the carry input of the full adders FA1 to FA5 and FA27 being 0. For the odd full adders FA17 and FA19 of the most-significant part of the lower row of full adders of the matrix configuration the response to the input signal combination (0,0,1) is tested by applying the test pattern (#6b), consisting of the partial products 000000, 000000, 000000 and 101011, the carry input of the full adders FA1 to FA5 and FA27 being 1. For the even full adders, in this case only the full adder FA18, of said most significant part the response to the input signal combination (0,0,1) is tested by applying the test pattern (#6a), consisting of the partial products 000000, 000000, 000000 and 010111, the carry input of the full adders FA1 to FA5 and FA27 being 1. By applying the test pattern (#8), consisting of the partial products 000011, 000011, 000011 and 000011, the response to the input signal combination (0,0,1) is tested for the even full adders FA20, FA22, FA24 and FA26 of the least-significant part of the lower row of full adders of the matrix configuration, the carry input of the full adders FA1 to FA5 and FA27 being 0. By applying the inverted test pattern (#8-), consisting of the partial products 111100, 111100, 111100 and 111100, the response to the input signal combination (0,0,1) is tested for the odd full adders FA21, FA23 and FA23 of said least-significant part, the carry input of the full adders FA1 to FA5 and FA27 being 1. Finally, for the full adder FA27 the response to the input signal combination (0,0,1) is tested by applying said test pattern (#1-) and the associated value of the carry input of the full adders FA1 to FA5 and FA27. The testing of the full adder FA16 after application of the input signal combination (0,0,1) will be described in detail hereinafter.

By applying said test pattern (#2-) and the associated value of the carry input of the full adders FA1 to FA5 and FA27, the response to the input signal combination (1,1,0) is tested for the odd rows of full adders, that is to say the full adders FA1 to FA5 and FA10 to FA15. By applying said test pattern (#2) and the associated value of the carry input of the full adders FA1 to FA5 and FA27, the response to the input signal combination (1,1,0) is tested for the even row of full adders, that is to say the full adders FA6 to FA10. For the odd full adders FA17 and FA19 of the most-signifcant part of the lower row of full adders of the matrix configuration the response to the input signal combination (1,1,0) is tested by said test pattern (#6a) and the associated value of the carry input of the full adders FA1 to FA5 and FA27. For the even full adders FA18 and FA20 of said most-significant part the response to the input signal combination (1,1,0) is tested by said test pattern (#6b) and the associated value of the carry input of the full adders FA1 to FA5 and FA27. By applying said test pattern (#8-) and the associated value of the carry input of the full adders FA1 to FA5 and FA27, the response to the input signal combination (1,1,0) is tested for the even full adders FA20, FA22, FA24 and FA26 of the least-significant part of the lower row of full adders of the matrix configuration. By applying said test pattern (#8) and the associated value of the carry input of the full adders FA1 to FA5 and FA27, the response to the input signal combination (1,1,0) is tested for the odd full adders FA21, FA23 and FA25 of said least-significant part. Finally, for the full adder FA27 the response to the input signal combination (1,1,0) is tested by said test pattern (#1) and the associated value of the carry input of the full adders FA1 to FA5 and FA27. The testing of the full adder FA16 for the input signal combination (1,1,0) will be described in detail hereinafter.

Figure 9:
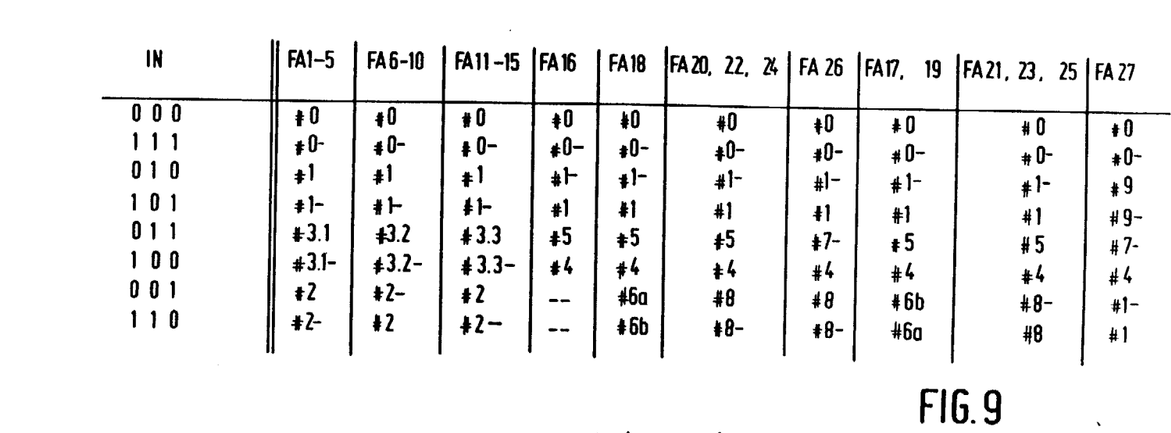
FIG. 9 shows a table containing the test patterns for testing the matrix configuration.

FIG. 9 shows a table in which the test patterns used are stated for the full adders FA1 to FA27 of the matrix configuration and for all input signal combinations. It appears from this table that for the testing of the full adders FA1 to FA15 and FA17 to FA27 in all eight input signal combinations and for the testing of the full adder FA16 in six of the eight input signal combinations a total number of 21 test patterns is used. Generally, $15+2(\frac{1}{2}k-1)$ test patterns are required and suffice for this purpose, where $\frac{1}{2}k$ is the number of partial products generated in the multiplier-accumulator. In the described embodiment $\frac{1}{2}k=4$.

It has been found that no test pattern can be found whereby the full adder FA16 can be tested in the input signal combinations (0,0,1) and (1,1,0). This problem can be solved by providing the modified Booth multiplier-accumulator with an inverter which, for testing the full adder FA16 in the input signal combinations (0,0,1) and (1,1,0), is inserted in the connection to one of the inputs of this full adder by means of an appropriate control signal. To this end, FIG. 8 shows an inverter 88 and a switch 90 which is controlled by a control signal T'. The switch normally occupies the position shown, but when the full adder FA16 is to be tested in the input signal combinations (0,0,1) and (1,1,0) it is set to the position which is not shown; the input signal combinations (1,0,1) and (0,1,0) are then actually applied to the assembly formed by the full adder and the inverter. The full adder FA16 is then tested by means of the test patterns (#1) and (#1-), respectively. The hardware modification introduced thus enables the full adder FA16 to be tested also in the input signal combinations (0,0,1) and (1,1,0), without new test patterns being required.

It is to be noted that, in addition to the test patterns used herein, use can also be made of test patterns which have the same effect; however, the number of test patterns required will then usually be greater.

For example, in the input signal combination (0,0,1) the full adders FA20, FA22 and FA24 can also be tested by means of the test pattern (#7-) instead of the test pattern (#8) and the full adders FA21, FA23 and FA25 can also be tested by means of the test patterns (#3.3), (#3.2) and (#3.1), respectively, instead of the test pattern (#8-). Similarly, in the input signal combination (1,1,0) the full adders FA20, FA22 and FA24 can also be tested by means of the not previously mentioned test pattern (#7) which consists of the partial products 001110, 001110, 001110 and 001110, the carry input of the full adders FA1 to FA5 and FA27 being 0, instead of by means of the test pattern (#8-), and the full adders FA21, FA23 and FA25 can also be tested by means of the test pattern (#3.3-), (#3.2-) and (#3.1-), respectively, instead of the test pattern (#8). For this method of testing the test pattern (#7) is added, so that for the present embodiment 22 test patterns are used for testing the matrix configuration 28.

TESTING THE ACCUMULATOR

For the testing of the full adders of the accumulator in six of the eight input signal combinations, use can be made of a number of test patterns which have also been used for testing the full adders of the matrix configuration. The carry input of the full adder determining the least-significant bit of the value to be obtained from the accumulator should then be accessible in a sense that a value associated with the relevant test pattern for the accumulator can be applied thereto. Due to the specific nature of the accumulator, the test patterns should now be supplied in a fixed sequence. The inputs (p,q,r) of the full adders of the accumulator, being the full adders FA28 to FA41 in FIG. 8, are defined as follows: p is the accumulator input, q is the input for the fed back accumulator output, and r is the carry input. For testing the full adders FA28 to FA41 in the input signal combinations (0,0,0), (1,0,0), (0,1,0), (1,1,1), (0,1,1) and (1,0,1), corresponding to said inputs, said test patterns (#0), (#0-), (#1), (#1-), (#2-) and (#2), respectively, are used in this sequence, the carry input of the full adder FA41 being 0, 0, 0, 1, 1, 1, respectively.

For testing the least-significant part of the accumulator, that is to say the full adders FA34 to FA41, in the input signal combinations (0,0,1) and (1,1,0), the test pattern (#10), consisting of the partial products 000100, 000100, 000100 and 000100, and the carry input of the full adders FA1 to FA5 and FA27 being 0, is applied to the matrix configuration twice in succession, the carry input of the full adder FA41 being 0 and 1, respectively after which the inverted test pattern (#10-), consisting of the partial products 111011, 111011, 1111011 and 111001 and the carry input of the full adders FA1 to FA5 and FA27 being 1, is applied to the matrix configuration, the carry input of the full adder FA41 being 0. First the even full adders are tested in the input signal combination (1,1,0) and the odd full adders are tested in the input signal combination (0,0,1), after which the odd full adders are tested in the input signal combination (1,1,0) and the even full adders are tested in the input signal combination (0,0,1). The matrix configuration then successively applies the values 10101010, 10101010 and 01010101 to the full adders FA34 to FA41, after which the accumulator output of these full adders outputs the values 10101010, 01010101 and 10101010, respectively.

Figure 10:
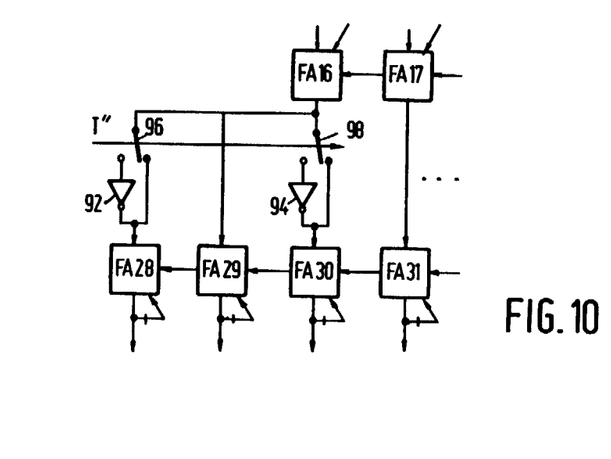
FIG. 10 shows a detail of the matrix configuration shown in FIG. 8.

For the testing of the most-significant part of the accumulator, that is to say the full adders FA28 to FA33, in the input signal combinations (0,0,1) and (1,1,0), said test pattern (#6a) is applied, the carry input of the full adders FA1 to FA5 and FA27 being 1, to the matrix configuration twice in succession, the carry input of the full adder FA41 being 0 and 1, respectively, after which the test pattern (#11), consisting of the partial products 000000, 000000, 000000 and 101000, is applied to the matrix configuration, the carry input of the full adders FA1 to FA5 and FA27 being 0 while the carry input of the full adder FA41 is 0. Furthermore, two inverters 92 and 94 (see FIG. 10) are to be inserted into the connection to a relevant input of the full adders FA28 and FA30 by means of a specific control signal during the testing of the most-significant part of the accumulator in the input signal combinations (0,0,1) and (1,1,0). This situation is shown in FIG. 10; using the control signal "T", the inverters 92 and 94 can be included, via associated switches 96 and 98, in the connection from the full adder FA16 to the full adders FA28 and FA30. As a result, the latter full adders can be tested as if the input signal combinations (1,0,1) and (0,1,1) have been generated. For the testing of the most-significant part of the accumulator in this manner, first the even full adders are tested in the input signal combination (1,1,0) and the odd full adders are tested in the output signal combination (0,0,1), after which the odd full adders are tested in the input signal combination (1,1,0) and the even full adders are tested in the input signal combination (0,0,1). The values 101010, 101010 and 010101 are successively applied to the full adders FA28 to FA33, after which the accumulator output of these full adders outputs the values 101010, 010101 and 101010, respectively.

TESTING THE MATRIX CONFIGURATION BY MEANS OF A CONSTANT NUMBER OF TEST PATTERNS

The testing of the matrix configuration in the described manner has revealed that the number of test patterns used for testing all full adders of the matrix configuration in all input signal combinations is dependent of the number of partial products. By including further inverters in the same way as described above for the testing of the full adder FA16 and the full adders FA28 and FA30 (see FIG. 10) in the connections denoted by the reference K in FIG. 8, test patterns can be found for testing the rows of full adders, in this case the full adders FA1 to FA15, whose number is independent of the number of such rows of full adders. The inverters are included, using a specific control signal to be applied during the testing of the full adders FA1 to FA15 in the input signald combinations (0,1,1) and (1,0,0), in the connections denoted by the reference K of the full adders FA1, FA2, FA3, FA5, FA6, FA7, FA11, FA12 and in the connections between the sum output of the full adder FA11 and the input of the full adder FA16. The test patterns (#12) and (#12-) used are formed by the partial products 101011, 010100, 101011 and 010100 and by the inverse values thereof, respectively, the carry input of the full adders FA1 to FA5 and FA27 being 0 and 1, respectively. First the series of even full adders, extending in diagonals in the matrix configuration, that is to say the series (FA6, FA12) (FA2, FA8, FA14) and (FA4, FA10) are tested in the input signal combination (1,0,0) and also the series of odd full adders extending in diagonals in the matrix configuration, that is to say the series (FA11), (FA1, FA7, FA13), (FA3, FA9, FA15) and (FA5) are tested in the input signal combination (0,1,1), said series of odd full adders being subsequently tested in the input signal combination (1,0,0) while said series of even full adders are tested in the input signal combination (0,1,1). In other words, two test patterns suffice, regardless of the number of partial products. In this embodiment, comprising a comparatively large amount of additional hardware, 17 test patterns suffice for testing the entire matrix configuration in all input signal combinations.

The described method of testing the matrix configuration and the accumulator is independent of the length of the multiplicand X or the multiplier Y. The test patterns result from specific X and Y values. These specific X, Y values can be systematically expanded as regards number of bits, without the composition of the test patterns being essentially modified. As a result, the design of the multiplier-accumulator can be parameterized in the length of X and Y, which must be considered as a major advantage.

TESTING THE BOOTH ENCODER AND THE MULTIPLEX CIRCUIT

The test patterns for the Booth encoder and the multiplex circuit will be described hereinafter. These two components of the multiplier-accumulator both comprise dynamic "pass" transistor logic, so that in principle a test procedure must be created for the case where a single "stuck at one" error occurs as well for the case where a single "stuck at zero" error occurs in said components. At the junction of a number of parallel transistor paths a stuck-at-one error can create an intermediate voltage level, so that the digital value thereof is unknown, while a stuck-at-zero error creates a dynamic storage function at the relevant junction.

For the Booth encoder as shown in FIG. 1 and for the encoding circuits contained therein, for example as shown in FIG. 3, it holds good that, assuming the situation in which the voltage on the output of the gate circuits in the sub-circuits shown in FIG. 3 is 1, after application of successively:

$y(i-1)$ $y(i)$ $y(i+1)=0$ 0 0, a stuck-at-one error can be established in the FETs 100 or 106 of the sub-circuit 44, and a stuck-at-zero error in the FETs 52 or 54 of the sub-circuit 42;

$y(i-1)$ $y(i)$ $y(i+1)=1$ 1 1, a stuck-at-one error can be established in the FETs 110 or 112 of the sub-circuit 46 and a stuck-at-zero error in the FETs 56 or 58 of the sub-circuit 42;

$y(i-1)$ $y(i)$ $y(i+1)=0$ 1 0, a stuck-at-one error can be established in the FETs 52 or 118 of the sub-circuits 42 and 48, respectively, and a stuck-at-zero error in the FETs 100 or 102 of the sub-circuit 44;

$y(i-1)$ $y(i)$ $y(i+1)=1$ 0 1, a stuck-at-one error can be established in the FETs 56 or 122 of the sub-circuits 42 and 50, respectively, and a stuck-at-zero error in the FET 112 or 114 of the sub-circuit 46;

$y(i-1)$ $y(i)$ $y(i+1)=1$ 1 0, a stuck-at-one error can be established in the FETs 102 or 104 of the sub-circuit 44 and a stuck-at-zero error in the FETs 116 or 118 of the sub-circuit 48;

$y(i-1)$ $y(i)$ $y(i+1)=0$ 1 1, a stuck-at-one error can be established in the FETs 58 or 120 of the sub-circuits 42 and 50, respectively, and a stuck-at-zero error in the FETs 108 or 110 of the sub-circuit 46;

$y(i-1)$ $y(i)$ $y(i+1)=0$ 0 1, a stuck-at-one error can be established in the FETs 108 or 114 of the sub-circuit 46 and a stuck-at-zero error in the FETs 120 or 122 of the sub-circuit 50;

$y(i-1)$ $y(i)$ $y(i+1)=1$ 0 0, a stuck-at-one error can be established in the FETs 54 or 116 of the sub-circuits 42 and 48, respectively, and a stuck-at-zero error in the FETs 104 or 106 of the sub-circuit 44.

Figure 11:
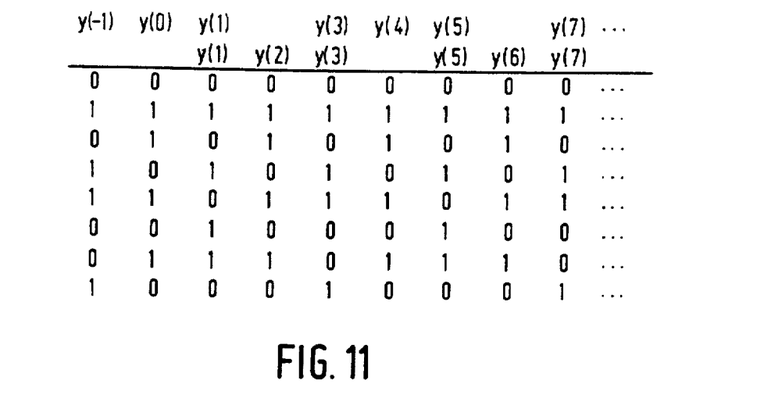
FIGS. 11, 12, 13 and 14 show tables containing the test patterns for testing the Booth encoder and the multiplex circuit.

Because each time two successive encoding circuits have one input signal in common, the same combinations of $y(i-1)$ $y(i)$ $y(i+1)$ cannot always be simultaneously applied to all encoding circuits. For example, when the combination $y(-1)$ $y(0)$ $y(1)$ 110 is applied to the encoding circuit 32 (see FIG. 2), a combination $y(1)$ $y(2)$ $y(3)$ where 0 x x, must be applied to the encoding circuit 34. Taking into account this fact, the eight test patterns shown in FIG. 11 can be used for testing the encoding circuits in the Booth encoder.

Thus, these test patterns are formed by a specifically supplied Y-value, supplemented by $y(-1)$ and, if n is odd, also by $y(n)$. It is to be noted that in this context no requirements are imposed as regards the X-value. Further requirements as regards the X-value, however, are imposed in view of the propagation of errors through the multiplex circuit; this aspect will be described in detail hereinafter.

A single stuck-at-one error in the multiplex circuit results in two conductive FETs. If the relevant input values of these FETs differe, an intermediate voltage level will occur; the inverter 86 (see FIG. 7) of one of the multiplexers of the multiplex circuit recognizes this value as a logic 0 or a logic 1. A single stuck-at-zero error causes the situation in the multiplex circuit in which not one FET is conductive, so that a dynamic storage function arises at the junctions of the multiplexers.

The testing for stuck-at-zero errors will be described with reference to the multiplexer shown in FIG. 7, use being made of signal combinations having the following appearance:

$(x(i-1), x(i), (0), (+1), (-1), (+2), (-2))$.

For example, assuming that the FET 76 exhibits a stuck-at-zero error, first the output of the inverter 86 is initialized via another FET, for example the FET 78, by applying, for example the test pattern (0,0,0,1,0,0,0), so that the output F of the inverter 86 becomes 0. A second test pattern should then have a path available through the FET 76 to be tested. To this end, for example the test pattern (d,d,1,0,0,0,0) is applied, (where d indicates a don't care state of the relevant bit), resulting in F = 1 if the FET 76 is correct and in an unmodified value of F, i.e. F=0, if the FET 76 is faulty. Thus, two test patterns are required: one for initializing and one for error detection. A test pattern for error detection, however, can also be used as an initialization test pattern for testing a next FET in the multiplexer. Specific combinations of input values of the encoding circuits in the Booth encoder correspond to the test patterns for initializing and error detection. In the above example, it holds for the initialization test pattern that only the output signal (+1) of an encoding circuit is 1, while it holds good for the error detection pattern that only the output signal (0) is 1, so that the encoding circuit input combinations 010 (or 001) and 000 (or 111), respectively, correspond thereto.

Figure 12:
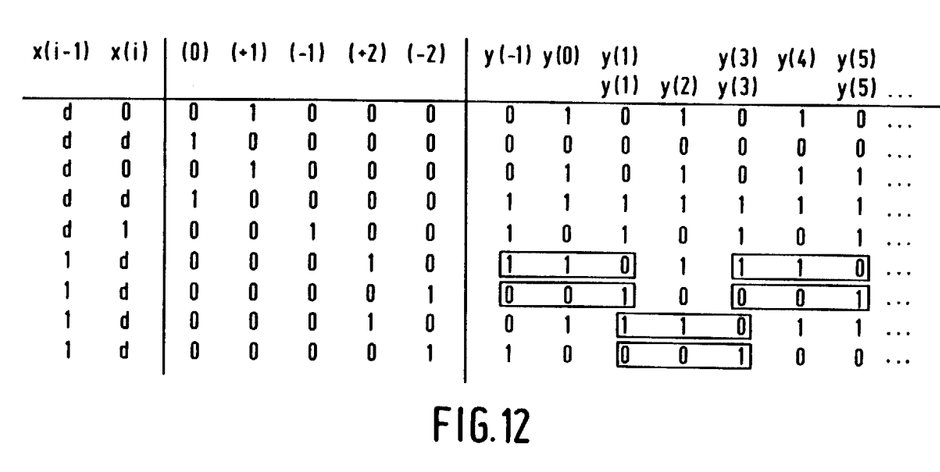

For the testing of the stuck-at-zero errors in the multiplexers, for example use can be made of test patterns in a fixed sequence as shown in FIG. 12. The total number of test patterns amounts to 9, regardless of the length of the X, Y values.

The first test pattern is used for initialization, it being assumed that the FET 78 is not faulty; this test pattern results in a value F=0. The second test pattern serves for the testing of the FET 76, but also as an initialization test pattern for the testing of the FET 78. If the FET 76 is correct, F becomes 1; if the FET 76 is faulty, F remains 0. The third test pattern serves for testing of the FET 78. Assuming that the FET 76 was correct, F=0 if the FET 78 is correct; if the FET 78 is faulty, F remains 1. The fourth test pattern serves as the initialization test pattern for the testing of the FET 80. The FET 80 is tested by means of the fifth test pattern. The sixth test pattern serves for the testing of the FET 82 which forms part of a multiplexer which is connected to an encoding circuit whereto an odd group of 3 bits (being the groups $y(-1)$ (0) $y(1)$; $y(3)$ $y(4)$ $y(5)$; etc.) is applied. The seventh test pattern serves for the testing of the FET 84 which is associated with a multiplexer which is connected to an encoding circuit whereto an odd group of 3 bits is applied. The eighth test pattern serves for the testing of the FET 82 associated with a multiplexer connected to an encoder circuit whereto an even group of 3 bits is applied (being the groups $y(1)$ $y(2)$ $y(3)$; $y(5)$ $y(6)$ $y(7)$, etc.). Finally, the ninth test pattern serves for the testing of the FET 84 associated with a multiplexer connected to an encoding circuit whereto an even group of 3 bits is applied.

This series of test patterns enables parallel testing of all multiplexers in the multiplex circuit. It is to be noted that instead of the bits $x(i-1)$ and $x(i)$ there may be fixed values or, in other words, $x(i-1)$ and $x(i)$ for $i=-1, 0$ and m may be 0 as appears from FIG. 6 and the table shown in FIG. 5.

Figure 13:
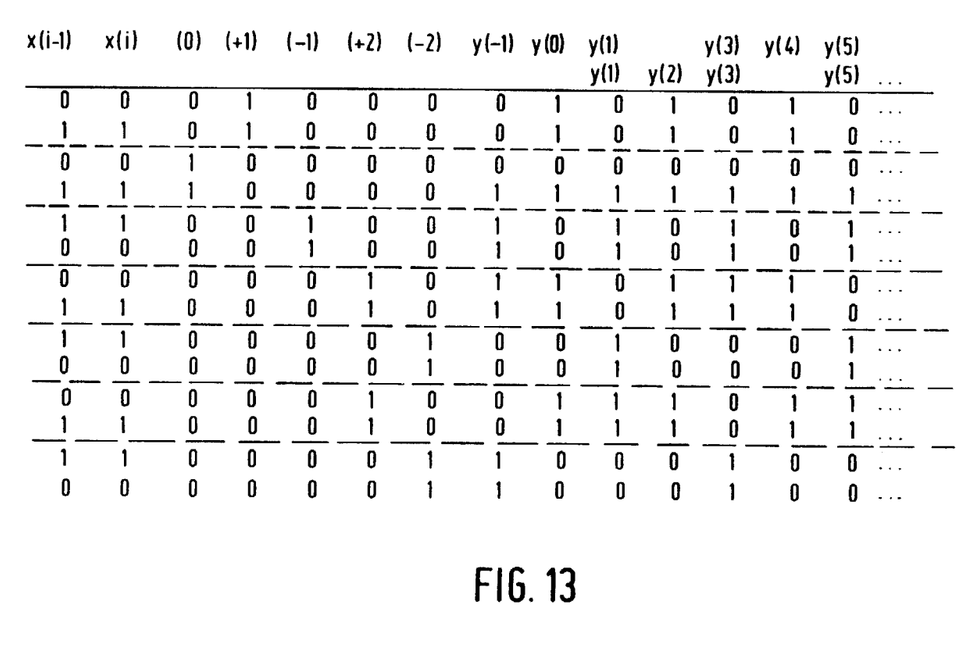

For stuck-at-one errors in the multiplexers, again two test patterns are used for establishing an error: first a test pattern for the assumption that the intermediate voltage level detected by the inverter 86 is recognized as a logic 0, followed by a second test pattern for the assumption that the intermediate voltage level recognized by the inverter 86 is interpreted as a logic 1. In total 14 test patterns suffice, a possible selection in this respect being shown in FIG. 13. In this case no fixed sequence of the test patterns is required. For example, when the test pattern (1,1,0,0,1,0,0) is applied, F will be 0 if no faulty FET is present; however, if $F=1$, one of the FETs 76, 78, 82 will be faulty. When the test pattern (0,0,0,0,1,0,0) is applied, F will be 1 if no faulty FET is present; however, if $F=0$, one of the FETs 78, 82 will be faulty.

Errors in the multiplex circuit should preferably be propagated through the matrix configuration and the accumulator, and errors in the Booth encoder through the multiplex circuit and preferably through the matrix configuration and the accumulator. Because the latter two units are composed of full adders, error propagation therein will not be problematic and no special steps will be required. The problem is to ensure that errors in the Booth encoder can pass through the multiplex circuit. An error in the output of the Booth encoder results in an incorrect gate voltage of a FET in the multiplex circuit. A single stuck-at-one error in a gate circuit of a FET in the Booth encoder can result in two FETs in a multiplexer being turned on. A single stuck-at-zero error in a gate circuit of a FET of the Booth encoder can result in a situation in which not a single FET in a multiplexer will be turned on. The propagation problem can be solved by selecting the test patterns for the multiplex circuit and the Booth encoder so that error detection test patterns for "stuck-at" errors in the Booth encoder coincide with test patterns for equivalent "stuck-at" errors in the multiplex circuit.

As has already been stated, a stuck-at-one error can be established in the FETs 102 or 104 of the sub-circuit 44 of FIG. 3, for example by means of $y(i-1) y(i) y(i+1)=110$. An error of this kind results in a value $(+1)=1$, while normally $(+2)=1$ for this encoding circuit input signal combination. As a result, the FETs 78 and 82 in the multiplexer shown in FIG. 7 will be simultaneously turned on. Thus, a stuck-at-one error in the Booth encoder has the same consequences as a stuck-at-one error in one of the FETs 78 or 82 of the multiplexer. By selecting the multiplexer test pattern associated with one of these two errors possibilities, it becomes possible to propagate said error in the Booth encoder through the multiplexer.

Figure 14:
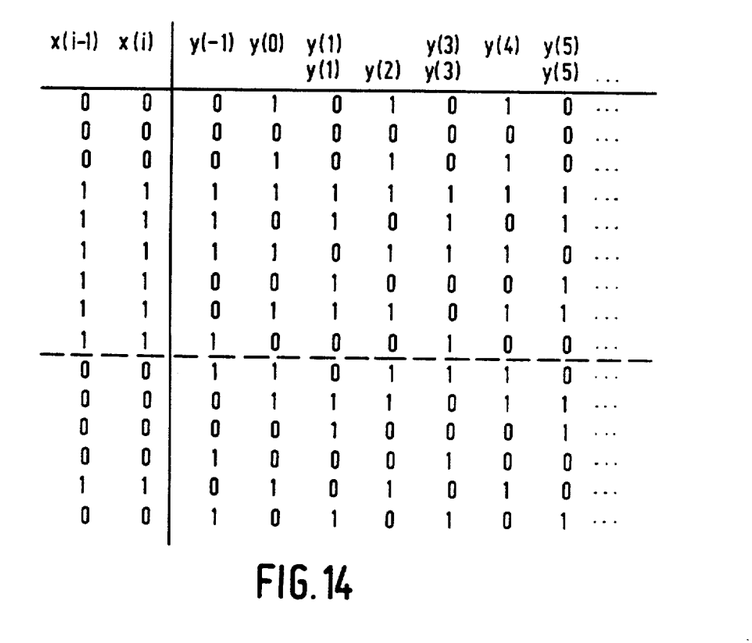

FIG. 14 shows an example of test patterns which are suitable for stuck-at-one and stuck-at-zero errors and for the propagation of such errors in the Booth encoder through the multiplex circuit. The table shown in FIG. 14 contains 15 test patterns formed by combining the tables shown in the FIGS. 12 and 13. Combination was made possible by the don't care states in the values of $x(i-1)$ and $x(i)$ in the table shown in FIG. 12. The first 9 test patterns refer to stuck-at-one errors, and the next 6 patterns refer to stuck-at-zero errors.

It will be apparent from the foregoing that different combinations of test patterns are feasible; however, for stuck-at-zero errors a fixed sub-sequence of test patterns will be applicable.

What is claimed is:

1. A method for testing a modified Booth multiplier, which multiplier is for multiplying an m-bit signal by an n-bit signal to produce a product signal X·Y, the m-bit signal being of the form $X=x(m-1)\ldots x(1) x(0)$, where x(0) is the least significant bit of X, the n-bit signal being of the form $Y=y(n-1)\ldots y(1) y(0)$, where y(0) is the least significant bit of Y, which modified Booth multiplier includes:

(a) a Booth encoder for converting the n-bit signal into a series of multiplication signals of the form $Y'=y'(k-2)\ldots y'(2) y(0)$, where $k=n$ if n is even and $k=n+1$ if n is odd, the Booth encoder converting the n-bit signal in groups of 3 bits which overlap each time by 1 bit, the groups of 3 bits taking the form $y(i-1) y(i) y(i+1)$, where $i=0, 2, 4,\ldots n-2$ if n is even and $i=0, 2, 4,\ldots n-1$ if n is odd, with $y(-1)$ and, if n is odd, $y(n)$, having a respective adjustable value;

(b) a multiplex circuit for forming partial products of the form: $X\cdot y'(j)$; and (c) a matrix configuration of full adders for adding successive partial products in incremental positions, each full adder having three inputs, the full adders being arranged in groups, there being a first row of full adders; the method comprising the steps of:

(d) first applying respective Y parts of a plurality of first test patterns as respective n-bit signals, each Y part of the first test patterns including a respective succession of test groups of three bits taking the form $y(i-1) y(i) y(i+1)$, which test groups of three bits successively overlap each other by 1 bit, the Y parts of the first test patterns being such that each of the test groups of 3 bits successively assumes each of the 8 combinations possible for three bits, the test groups of 3 bits being applied at the inputs of the Booth encoder;

(e) propagating any errors occurring in the Booth encoder or the multiplex circuit as a result of the first test patterns using respective associated X parts of the first test patterns as respective m-bit signals;

(f) assigning to the adjustable value of $y(-1)$, and if n is odd also of y(n), respective first values associated with respective ones of the first test patterns;

(g) second applying second test patterns, the second test patterns being such that, within one of the groups of full adders, each full adder successively receives at its inputs the 8 possible combinations possible for three bits, each full adder within the one group simultaneously receiving a same signal combination; and (h) third applying respective second values, associated with respective ones of the second test patterns, to a carry input of of the full adders in the first row and to a carry input of the full adder which determines a least significant bit of the product signal X·Y; and (j) determining whether the modified Booth multiplier is defective based on the product signals X·Y resulting from the first and second test patterns.

2. A method as claimed in claim 1, wherein:

(a) the multiplex circuit is a row of multiplexers, each of the multiplexers having inputs for receiving signals which are determined by bits x(l−1) and x(l), where l=−1, 0, −1, ..., m; and (b) the first applying and propagating steps comprise using, as said first test patterns, 14 test patterns for possibly occurring stuck-at-one errors and 9 test patterns for possibly occurring stuck-at-zero errors, each of said first test patterns comprising a Y part supplemented by y(−1) and, if n is odd also by y(n), together with bits x(l−1), x(l), the bits (l−1) and x(l) being chosen in succession to test each of the multiplexers in the row, the bits x(−2), x(−1) and x(m) having respective values which are predetermined according to the multiplication signals known to result when the respective Y parts of the first test patterns are applied to the Booth encoder.

3. The method of claim 2 wherein the 14 test patterns are as listed in the following table:

6. The method of claim 4 wherein the 15 test patterns are as listed in the following table:

| x(i − 1) | x(i) | y(−1) | y(0) | y(1) y(1) | y(2) | y(3) y(3) | y(4) | y(5) y(5) |
|---|---|---|---|---|---|---|---|---|
| 0 | 0 | 0 | 1 | 0 | 1 | 0 | 1 | 0 |
| 0 | 0 | 0 | 0 | 0 | 0 | 0 | 0 | 0 |
| 0 | 0 | 0 | 1 | 0 | 1 | 0 | 1 | 0 |
| 1 | 1 | 1 | 1 | 1 | 1 | 1 | 1 | 1 |
| 1 | 1 | 1 | 0 | 1 | 0 | 1 | 0 | 1 |
| 1 | 1 | 1 | 1 | 0 | 1 | 1 | 1 | 0 |
| 1 | 1 | 0 | 0 | 1 | 0 | 0 | 0 | 1 |
| 1 | 1 | 0 | 1 | 1 | 1 | 0 | 1 | 1 |
| 1 | 1 | 1 | 0 | 0 | 0 | 1 | 0 | 0 |
| 0 | 0 | 1 | 1 | 0 | 1 | 1 | 1 | 0 |
| 0 | 0 | 0 | 1 | 1 | 1 | 0 | 1 | 1 |
| 0 | 0 | 0 | 0 | 1 | 0 | 0 | 0 | 1 |
| 0 | 0 | 1 | 0 | 0 | 1 | 0 | 0 | 0 |
| 1 | 1 | 0 | 1 | 0 | 1 | 0 | 1 | 0 |
| 0 | 0 | 1 | 0 | 1 | 0 | 1 | 0 | 1 |

| x(i − 1) | x(i) | (0) | (+1) | (−1) | (+2) | (−2) | y(−1) | y(0) | y(1) y(1) | y(2) | y(3) y(3) | y(4) | y(5) y(5) |
|---|---|---|---|---|---|---|---|---|---|---|---|---|---|
| 0 | 0 | 0 | 1 | 0 | 0 | 0 | 0 | 1 | 0 | 1 | 0 | 1 | 0 |
| 1 | 1 | 0 | 1 | 0 | 0 | 0 | 0 | 1 | 0 | 1 | 0 | 1 | 0 |
| 0 | 0 | 1 | 0 | 0 | 0 | 0 | 0 | 0 | 0 | 0 | 0 | 0 | 0 |
| 1 | 1 | 1 | 0 | 0 | 0 | 0 | 1 | 1 | 1 | 1 | 1 | 1 | 1 |
| 1 | 1 | 0 | 0 | 1 | 0 | 0 | 1 | 0 | 1 | 0 | 1 | 0 | 1 |
| 0 | 0 | 0 | 0 | 1 | 0 | 0 | 1 | 0 | 1 | 0 | 1 | 0 | 1 |
| 0 | 0 | 0 | 0 | 0 | 1 | 0 | 1 | 1 | 0 | 1 | 1 | 1 | 0 |
| 1 | 1 | 0 | 0 | 0 | 1 | 0 | 1 | 1 | 0 | 1 | 1 | 1 | 0 |
| 1 | 1 | 0 | 0 | 0 | 0 | 1 | 0 | 0 | 1 | 0 | 0 | 0 | 1 |
| 0 | 0 | 0 | 0 | 0 | 0 | 1 | 0 | 0 | 1 | 0 | 0 | 0 | 1 |
| 0 | 0 | 0 | 0 | 0 | 1 | 0 | 0 | 1 | 1 | 1 | 0 | 1 | 1 |
| 1 | 1 | 0 | 0 | 0 | 1 | 0 | 1 | 1 | 1 | 1 | 0 | 1 | 1 |
| 1 | 1 | 0 | 0 | 0 | 0 | 1 | 1 | 0 | 0 | 0 | 1 | 0 | 0 |
| 0 | 0 | 0 | 0 | 0 | 0 | 1 | 1 | 0 | 0 | 0 | 1 | 0 | 0 |

4. The method of claim 2, wherein the 9 test patterns are as listed in the following table:

7. The method of claim 1, 2, or 5 wherein the second applying step comprises using as said second test pat-

| x(i − 1) | x(i) | (0) | (+1) | (−1) | (+2) | (−2) | y(−1) | y(o) | y(1) y(1) | y(2) | y(3) y(3) | y(4) | y(5) y(5) |
|---|---|---|---|---|---|---|---|---|---|---|---|---|---|
| d | 0 | 0 | 1 | 0 | 0 | 0 | 0 | 1 | 0 | 1 | 0 | 1 | 0 |
| d | d | 1 | 0 | 0 | 0 | 0 | 0 | 0 | 0 | 0 | 0 | 0 | 0 |
| d | 0 | 0 | 1 | 0 | 0 | 0 | 0 | 1 | 0 | 1 | 0 | 1 | 1 |
| d | d | 1 | 0 | 0 | 0 | 0 | 1 | 1 | 1 | 1 | 1 | 1 | 1 |
| d | 1 | 0 | 0 | 1 | 0 | 0 | 1 | 0 | 1 | 0 | 1 | 0 | 1 |
| 1 | d | 0 | 0 | 0 | 1 | 0 | 1 | 1 | 0 | 1 | 1 | 1 | 0 |
| 1 | d | 0 | 0 | 0 | 0 | 1 | 0 | 0 | 1 | 0 | 0 | 0 | 1 |
| 1 | d | 0 | 0 | 0 | 1 | 0 | 0 | 1 | 1 | 1 | 0 | 1 | 1 |
| 1 | d | 0 | 0 | 0 | 0 | 1 | 1 | 0 | 0 | 0 | 1 | 0 | 0 |

5. The method of claim 1 wherein:

(a) the multiplex circuit is a row of multiplexers, each of the multiplexers having inputs for receiving signals which are determined by bits x(l−1) and x(l), where l=−1, 0, −1, ..., m; and (b) the first applying and propagating steps comprise using, as said first test patterns, 15 test patterns for possibly occurring stuck-at-one errors and for possibly occurring stuck-at-zero errors, each of said first test patterns comprising a Y part supplemented by y(−1), and, if n is odd also by y(n), together with bits x(l−1), x(l), the bits x(l−1) and x(l) being chosen in succession to test each of the multiplexers in the row, the bits x(−2), x(−1) and x(m) having respective values which are predetermined according to the multiplication signals known to result when the respective Y parts of the first test patterns are applied to the Booth encoder.

terns a plurality of test patterns each comprising −k partial products, said plurality comprising 15 +2(k/2 −1) test patterns for testing all full adders of the matrix configuration, said plurality of test patterns successively applying to the three inputs of each of the full adders each of the 8 signal combinations possible for three bits, with the exception that for that full adder, which determines the most significant bit of the product signal X·Y, said plurality of test patterns successively applies 6 of the 8 signal combinations possible for three bits.

8. The method of claim 7 comprising the further step of providing a remaining to signal combinations to test that full adder which determines the most significant bit of the product signal X·Y, which providing step comprises inverting two of said plurality of test patterns.

9. The method of claim 7, wherein
(a) the modified Booth multiplier further comprises an accumulator which comprises full adders and which is connected to the matrix configuration, the full adders each having three inputs; and (b) the method further comprises the step of providing to the accumulator third test patterns which are such that each of the full adders successively receives 6 of the 8 signal combinations possible for three bits, said third test patterns being the same as 6 of the second test patterns, the carry input of that full adder, which determines the least significant bit of an output of the accumulator, receiving respective values associated with respective ones of said third test patterns.

10. The method of claim 1, wherein (a) the modified Booth multiplier further comprises an accumulator which comprises full adders and which is connected to the matrix configuration, the full adders each having three inputs; and (b) the method further comprises the step of providing to the accumulator third test patterns which are such that each of the full adders successively receives 6 of the 8 signal combinations possible for three bits, said third test patterns being the same as 6 of the second test patterns, the carry input of that full adder, which determines the least significant bit of an output of the accumulator, receiving respective values associated with respective ones of said third test patterns.

11. The method of claim 10 further comprising, (a) for testing that full adder which determines the least significant bit of an output of the accumulator, with respect to the remaining 2 signal combinations, the following steps:
  (i) using two further third test patterns, which two further test patterns are bitwise inverse representations of one another;
  (ii) applying a first one of these two further third test patterns to the matrix configuration twice in succession; and
  (iii) then applying a second one of these two further test patterns to the matrix configuration; and (b) for testing those full adders which constitute a remaining, most significant part of the accumulators;
  (i) using one of the second test patterns;
  (ii) applying the one second test pattern to the matrix configuration twice in succession; and
  (iii) then applying yet a further third test pattern to the matrix configuration, while inverting one of the input signals of: the most significant full adder, the most significant full adder but two, and the most significant full adder but four.

12. The method of claim 1 wherein:

(a) a number of said second test patterns is independent of of the number n;

(b) the full adders of the matrix configuration are all arranged in rows; and (c) the method further comprises the step of inverting the following full adder input signals:
  (i) in each row, the carry input signal of the most significant full adders;
  (ii) in the first row, the carry input signals of the most significant full adder but two, and the carry input of the most significant full adder but four;
  (iii) in all but the first row, that input signal which originates from a sum output of a full adder of a preceding row and which is connected to:
    (A) the most significant full adder but one; and
    (B) the full adder which determines the most significant bit of the product signal; and/or
  (iv) in the first row, the input signal, of the most significant full adder but one, which corresponds to the inputs inverted in 29. (c) (iii).

13. A modified Booth multiplier for multiplying an m-bit signal by an n-bit signal to produce a product signal X·Y, the m-bit signal being of the form $X = x(m-1) \ldots x(1) x(0)$, where $x(0)$ is the least significant bit of X, the n-bit signal being of the form $Y = y(n-1) \ldots y(1) y(0)$, where $Y(0)$ is the least significant bit of Y, the modified Booth multiplier comprising:

(a) a Booth encoder for converting the n-bit signal into a series of multiplication signals of the form $Y' = y'(k-2) \ldots y'(2) y(0)$, where $k = n$ if n is even and $k = n+1$ if n is odd, the Booth encoder converting the n-bit signal in groups of 3 bits which overlap each time by 1 bit, the groups of 3 bits taking the form $y(i-1) y(i) y(i+1)$, where $i = 0, 2, 4, \ldots n-2$ if n is even and $i = 0, 2, 4, \ldots n-1$ if n is odd, with $y(-1)$ and, if n is odd, $y(n)$, having a respective adjustable value;

(b) a multiplex circuit for forming partial products of the form: $X \cdot y'(j)$ from the multiplication signals;

(c) a matrix configuration of full adders for adding successive partial products in incremental positions, each full adder having three inputs including a carry input, the full adders being arranged in groups, there being a first row of full adders; and (d) means for testing comprising:
  (i) a first connection coupled to supply the adjustable value $y(-1)$, and if n is odd, the value $y(n)$, and in particular for supplying a value associated with a first test pattern for testing the Booth encoder;
  (ii) at least one second connection to:
    (A) the carry inputs of the full adders in the first row; and
    (B) the carry input of the full adder which determines the least significant bit of the product signal X·Y;

which second connection is for supplying a second value associated with a second test pattern for testing the matrix configuration.

14. The modified Booth multiplier of claim 13 further comprising, for testing that full adder which determines the least significant bit of the product signal X·Y:

(a) an inverter; and (b) switching means for switching the inverter, so that the supplies parts of two predetermined signal combinations to that full adder, the two predetermined signal combinations being those two, out of the eight signal combinations possible for three bits, which cannot be supplied to the inputs of that full adder using partial products alone.

15. The modified Booth multiplier of claim 13 or 14 further comprising an accumulator which is connected to the matrix configuration, the accumulator comprising:

(a) a plurality of full adders; and (b) an accumulator connection to the carry input of the full adder which determines the least significant bit of an output signal of the accumulator, the accumulator connection being for supplying a third value associated with a test pattern for testing the accumulator.

16. The modified Booth multiplier of claim 15, wherein the accumulator comprises:

(a) further accumulator connections to the following full adders within the accumulator: the most significant full adder, the most significant full adder but two, and the most significant full adder but four;

(b) a plurality of inverters; and (c) a plurality of further switching means, each for switching a respective one of the inverters, so that the inverters supply, to the further accumulator connections, parts of two predetermined input signal combinations.

17. The modified Booth multiplier of claim 13, wherein the matrix configuration comprises:

(a) a plurality of inverters; and (b) a plurality of switching means, each for switching to a respective one of the plurality of invertersso that the inverters supply:

(i) in each row, the carry input signal of the most significant full adder;

(ii) in the first row, the carry input signals of the most significant full adder but two, the carry input of the most significant full adder but four, etc.;

(iii) in all but the first row, that input signal which originates from a sum output of a full adder of a preceding row and which is connected to:

(A) the most significant full adder but one; and/or (B) the full adder which determines the most significant bit of the product signal; and (iv) in the first row, the input signal, of the most significant full adder but one, which corresponds to the inputs inverted in 29. (c) (iii).

18. An integrated circuit comprising the modified Booth multiplier as claimed in claim 13.

19. A testable modified-Booth algorithm multiplier comprising:

first means for presenting a first operand signal including a lowest significance level dummy bit;

a modified-Booth algorithm encoder fed by said first means for generating a sequence of multiplexer control signals (24);

a second means for presenting a second operand signal;

a multiplexer fed by said second means and by said encoder for under control of each multiplexer control signal generating an associated partial product;

a full adder matrix (28) having p rows of q full adders each, wherein p+1 is equal to the number of partial products receivable and q+1 is the number of bits per partial product, and also a final row of 2(q+1) full adders, wherein said first means has test pattern presentation means in that said dummy bit has an interchangeable value.

20. A testable multiplier as claimed in claim 19, wherein said first means has second test pattern presentation means in that a highest level and a second highest level of said first operand have mutually independent values.

21. A testable multiplier as claimed in claim 19, wherein said full adder matrix has third test pattern presentation means in that the final row has a most significant level full adder provided with a selectively activatable input bit inverter.

22. A testable multiplier as claimed in claim 19, wherein said full adder matrix has fourth test pattern presentation means in that 2q+1 modules of mutually, non-highest, exclusive significance levels have commonly activatable input means for receiving either a zero or a one bit.

23. A testable multiplier as claimed in claim 19 and provided with an accumulator register of at least 2(q+2) full adders and having fifth test pattern presentation means in that the first, second and third highest significance level accumulator full adders are fed by a highest level sum output of the first adder matrix, and the first and third accumulator full adders are provided with a selectively coactivatable input inverter.

* * * * *